US009275756B2

(12) United States Patent
Oh

(10) Patent No.: US 9,275,756 B2
(45) Date of Patent: Mar. 1, 2016

(54) SEMICONDUCTOR TEST DEVICE AND METHOD OF GENERATING ADDRESS SCRAMBLE USING THE SAME

(71) Applicant: Samsung Electronics Co., Ltd., Suwon-Si, Gyeonggi-Do (KR)

(72) Inventor: Jin Taek Oh, Daejeon (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 543 days.

(21) Appl. No.: 13/666,273

(22) Filed: Nov. 1, 2012

(65) Prior Publication Data

US 2013/0117617 A1 May 9, 2013

(30) Foreign Application Priority Data

Nov. 3, 2011 (KR) .................. 10-2011-0113968

(51) Int. Cl.
    *G11C 29/00* (2006.01)
    *G11C 29/10* (2006.01)
    *G11C 29/18* (2006.01)

(52) U.S. Cl.
    CPC ............. *G11C 29/10* (2013.01); *G11C 29/18* (2013.01); *G11C 2029/1806* (2013.01)

(58) Field of Classification Search
    CPC ........ G11C 29/56; G11C 29/48; G11C 29/44;
        G11C 29/50; G11C 2029/4402; G11C 29/52;
        G11C 29/10; G11C 29/18; G11C 2029/1806;
        H05K 999/99; G06F 11/1016; G06F 11/1068;
        G06F 11/1064; G11B 20/1833; G01R
        31/2642; G01R 31/2851; G01R 31/2831
    USPC .................................. 714/768, 718, E11.177
    See application file for complete search history.

(56) References Cited

U.S. PATENT DOCUMENTS

| | | | | |
|---|---|---|---|---|
| 4,896,301 A | * | 1/1990 | Ogawa | 365/230.03 |
| 5,844,914 A | * | 12/1998 | Kim et al. | 714/718 |
| 6,330,693 B1 | * | 12/2001 | Lindsay | 714/42 |
| 2002/0169587 A1 | * | 11/2002 | Emek et al. | 703/2 |
| 2003/0182491 A1 | * | 9/2003 | Chudnovsky et al. | 711/5 |
| 2005/0041497 A1 | * | 2/2005 | Beer | 365/202 |
| 2006/0031725 A1 | * | 2/2006 | Kang | 714/718 |
| 2006/0067135 A1 | * | 3/2006 | Motomochi et al. | 365/189.04 |
| 2006/0200713 A1 | * | 9/2006 | Slobodnik et al. | 714/718 |
| 2007/0143568 A1 | * | 6/2007 | Gould | 711/203 |
| 2007/0234182 A1 | * | 10/2007 | Wickeraad et al. | 714/763 |
| 2009/0113217 A1 | * | 4/2009 | Dolgunov et al. | 713/190 |
| 2009/0193287 A1 | * | 7/2009 | Jeong | 714/3 |
| 2011/0119537 A1 | * | 5/2011 | Yasui | 714/718 |
| 2014/0208156 A1 | * | 7/2014 | Muralimanohar et al. | 714/6.24 |

FOREIGN PATENT DOCUMENTS

| JP | 07-282599 A | 10/1995 |
|---|---|---|
| JP | 2000-163990 A | 6/2000 |
| KR | 10-2007-0107415 A | 11/2007 |

* cited by examiner

*Primary Examiner* — Albert Decady
*Assistant Examiner* — Enamul M Kabir
(74) *Attorney, Agent, or Firm* — Harness, Dickey & Pierce, PLC

(57) ABSTRACT

The method of generating an address scramble includes receiving address information for each of a plurality of memory cells included in a semiconductor memory device and the address information that includes a logical address and a physical address corresponding to each of the memory cells; generating an address scramble logical expression, the address scramble logical expression relating logical addresses to physical addresses based on the address information; and reducing the address scramble logical expression using a given algorithm.

13 Claims, 15 Drawing Sheets

FIG. 4A

| BLOCK | SIZE(HEXA) | X ADDRESS (HEXA) |
|---|---|---|
| L0 | 1A0 | 0000 ~ 019F |
| L1 | 1A0 | 01A0 ~ 033F |
| L2 | 180 | 0340 ~ 04BF |
| L3 | 1A0 | 04C0 ~ 065F |
| L4 | 1A0 | 0660 ~ 07FF |
| L5 | 1A0 | 0800 ~ 099F |
| L6 | 1A0 | 09A0 ~ 0B3F |
| L7 | 180 | 0B40 ~ 0CBF |
| L8 | 1A0 | 0CC0 ~ 0E5F |
| L9 | 1A0 | 0E60 ~ 0FFF |
| L10 | 1A0 | 1000 ~ 119F |
| L11 | 1A0 | 11A0 ~ 133F |
| L12 | 180 | 1340 ~ 14BF |
| L13 | 1A0 | 14C0 ~ 165F |
| L14 | 1A0 | 1660 ~ 17FF |
| L15 | 1A0 | 1800 ~ 199F |
| L16 | 1A0 | 19A0 ~ 1B3F |
| L17 | 180 | 1B40 ~ 1CBF |
| L18 | 1A0 | 1CC0 ~ 1E5F |
| L19 | 1A0 | 1E60 ~ 1FFF |
| R0 | 1A0 | 2000 ~ 219F |
| R1 | 1A0 | 21A0 ~ 233F |
| R2 | 180 | 2340 ~ 24BF |
| R3 | 1A0 | 24C0 ~ 265F |
| R4 | 1A0 | 2660 ~ 27FF |
| R5 | 1A0 | 2800 ~ 299F |
| R6 | 1A0 | 29A0 ~ 2B3F |
| R7 | 180 | 2B40 ~ 2CBF |
| R8 | 1A0 | 2CC0 ~ 2E5F |
| R9 | 1A0 | 2E60 ~ 2FFF |
| R10 | 1A0 | 3000 ~ 319F |
| R11 | 1A0 | 31A0 ~ 333F |
| R12 | 180 | 3340 ~ 34BF |
| R13 | 1A0 | 34C0 ~ 365F |
| R14 | 1A0 | 3660 ~ 37FF |
| R15 | 1A0 | 3800 ~ 399F |
| R16 | 1A0 | 39A0 ~ 3B3F |
| R17 | 180 | 3B40 ~ 3CBF |
| R18 | 1A0 | 3CC0 ~ 3E5F |
| R19 | 1A0 | 3E60 ~ 3FFF |

FIG. 4B

| X-ADDRESS | |
|---|---|
| LOGICAL ADDRESS | PHYSICAL ADDRESS |
| Q0 | RA0 |
| Q1 XOR Q2 | RA1 |
| Q2 | RA2 |
| Q3 | RA3 |
| Q4 | RA4 |
| Q5 | RA5 |
| Q6 | RA6 |
| Q7 | RA7 |
| Q8 | RA8 |
| Q9 | RA9 |
| Q10 | RA10 |
| Q11 | RA11 |
| Q12 | RA12 |
| Q13 | RA13 |
| Y-ADDRESS | |
| LOGICAL ADDRESS | PHYSICAL ADDRESS |
| Q0 | CA2 |
| Q1 | CA3 |
| Q2 | CA4 |
| Q3 | CA5 |
| Q4 | CA6 |
| Q5 | CA7 |
| Q6 | CA8 |
| Q7 | CA9 |
| Q8 | CA0 |
| Q9 | CA1 |
| Q10 | CA11 |

FIG. 5

| BLOCK | BLOCK STRUCTURE INFORMATION ||||| 
|---|---|---|---|---|---|
| | bs1 | bs2 | bs3 | bs4 | bs5 |
| SIZE | 1A0 | 180 | – | – | – |
| SEQ. | 1-1-2-1-1 |||||

FIG. 8

```
X#0000-#027F=@
#0000,#0001,#019C,#019D,#01A0,#01A1,#033C,#033D,#0340,#0341,#04BC,#04BD,#04C0,#04C1,#04BC,#04BD,@
#0660,#0661,#07FC,#07FD,#0800,#0801,#08BC,#09BD,#09A0,#09A1,#0B3C,#0B3D,#0B40,#0B41,#0CBC,#0CBD,@
#0CC0,#0CC1,#0E5C,#0E5D,#0E60,#0E61,#0FFC,#0FFD,#1000,#1001,#119C,#119D,#11A0,#11A1,#133C,#133D,@
#1340,#1341,#14BC,#14BD,#14C0,#14C1,#14BC,#14BD,#1660,#1661,#17FC,#17FD,#1800,#1801,#19BC,#19BD,@
                                        ～ ～
#F340,#F341,#F4BC,#F4BD,#F4C0,#F4C1,#F4BC,#F4BD,#F660,#F661,#F7FC,#F7FD,#F800,#F801,#F9BC,#F9BD,@
#F9A0,#F9A1,#FB3C,#FB3D,#FB40,#FB41,#FCBC,#FCBD,#FCC0,#FCC1,#FCBC,#FCBD,#FE5C,#FE5D,#FE60,#FE61,#FFFC,#FFFD
```

FIG. 10

```
X15 =  (AX9(NOT) AND AX8 AND AX7(NOT) AND AX6 AND AX5(NOT) AND AX4(NOT) AND AX3(NOT) AND AX2(NOT) AND AX1(NOT) AND AX0(NOT))
   OR  (AX9(NOT) AND AX8 AND AX7(NOT) AND AX6 AND AX5(NOT) AND AX4(NOT) AND AX3(NOT) AND AX2(NOT) AND AX1(NOT) AND AX0)
   OR  (AX9(NOT) AND AX8 AND AX7(NOT) AND AX6 AND AX5(NOT) AND AX4(NOT) AND AX3(NOT) AND AX2(NOT) AND AX1 AND AX0(NOT))
   OR  (AX9(NOT) AND AX8 AND AX7(NOT) AND AX6 AND AX5(NOT) AND AX4(NOT) AND AX3(NOT) AND AX2(NOT) AND AX1 AND AX0)
   OR  (AX9(NOT) AND AX8 AND AX7(NOT) AND AX6 AND AX5(NOT) AND AX4(NOT) AND AX3(NOT) AND AX2 AND AX1(NOT) AND AX0(NOT))
   OR  (AX9(NOT) AND AX8 AND AX7(NOT) AND AX6 AND AX5(NOT) AND AX4(NOT) AND AX3(NOT) AND AX2 AND AX1(NOT) AND AX0)
   OR  (AX9(NOT) AND AX8 AND AX7(NOT) AND AX6 AND AX5(NOT) AND AX4(NOT) AND AX3(NOT) AND AX2 AND AX1 AND AX0(NOT))
   OR  (AX9(NOT) AND AX8 AND AX7(NOT) AND AX6 AND AX5(NOT) AND AX4(NOT) AND AX3(NOT) AND AX2 AND AX1 AND AX0)
                                                        ~ ~
   OR  (AX9 AND AX8(NOT) AND AX7(NOT) AND AX6 AND AX5 AND AX4 AND AX3 AND AX2 AND AX1(NOT) AND AX0(NOT))
   OR  (AX9 AND AX8(NOT) AND AX7(NOT) AND AX6 AND AX5 AND AX4 AND AX3 AND AX2 AND AX1(NOT) AND AX0)
   OR  (AX9 AND AX8(NOT) AND AX7(NOT) AND AX6 AND AX5 AND AX4 AND AX3 AND AX2 AND AX1 AND AX0(NOT))
   OR  (AX9 AND AX8(NOT) AND AX7(NOT) AND AX6 AND AX5 AND AX4 AND AX3 AND AX2 AND AX1 AND AX0)
```

FIG. 12

```
X15 =  (AX9(NOT) AND AX8 AND AX6)
   OR  (AX9(NOT) AND AX8 AND AX7)
   OR  (AX9 AND AX8(NOT) AND AX7(NOT))
```

SEMICONDUCTOR TEST DEVICE AND METHOD OF GENERATING ADDRESS SCRAMBLE USING THE SAME

CROSS-REFERENCE TO RELATED APPLICATIONS

This application claims priority under 35 U.S.C. §119(a) from Korean Patent Application No. 10-2011-0113968 filed on Nov. 3, 2011, the disclosure of which is hereby incorporated by reference in its entirety.

BACKGROUND

Example embodiments of the inventive concepts relate to a semiconductor test device, and more particularly, to a semiconductor test device for automatically generating an address scramble and/or a method of generating an address scramble using the same.

With the increase in the storage capacity and operation speed of a semiconductor memory device, the number of transistors included in the semiconductor memory device has increased. Accordingly, the probability of occurrence of failures in semiconductor memory devices has also increased. Therefore, it has been important to probe and detect the failures.

To test a semiconductor memory device for a failure, data is written to a plurality of memory cells in the semiconductor memory device and then data is read from the memory cells. The data that has been written is compared with the data that has been read, so that the semiconductor memory device is judged good or bad based on a comparison result.

A memory cell array of a semiconductor memory device does not have a structure in which row addresses and column addresses sequentially increase. Therefore, an investment in improving equipment and commitment of work force is required to realize an address scramble.

In addition, the semiconductor memory device has a complex and irregular block structure in a memory cell array in order to improve its characteristics and optimize its area. Accordingly, the probability of occurrence of human errors in making a program is increasing.

In a test process, an address scramble is generated using a partial test in which a test operation is carried out on only part of memory cells in order to increase productivity. For the partial test, a method of matching a logical address and a physical address one on one and a method of developing a logical expression for each address pin is used.

However, the method of matching the logical and physical addresses one on one is restrictively used in certain test devices. The method of developing the logical expression is likely to cause human errors and delay compiling time since the logical expression is massive.

Therefore, it is desired to generate an address scramble that is not restricted to certain semiconductor test devices based on the block structure of semiconductor memory device.

SUMMARY

According to some example embodiments of the inventive concepts, there is provided a method of generating an address scramble used to test a semiconductor memory device. The method may include receiving address information for each of a plurality of memory cells included in the semiconductor memory device, the address information including a logical address and a physical address that correspond to each of the memory cells; generating an address scramble logical expression, the address scramble logical expression relating logical addresses to physical addresses based on the address information; and reducing the address scramble logical expression using a given algorithm.

The method may include receiving block structure information may include size information corresponding to each of a plurality of memory blocks, into which the memory cells are grouped, and sequence information of the memory blocks with respect to the size information. The address scramble logical expression may be generated based on the address information and the block structure information.

The generating the address scramble logical expression may include sorting the address information by hexadecimal numbers; producing a partial address region based on the sorted address information; and re-numbering the logical addresses included in the partial address region and converting the physical addresses and the re-numbered logical addresses that are comprised in the partial address region into binary numbers.

The sorting the address information by hexadecimal numbers may include sorting the physical addresses included in the address information by hexadecimal numbers based on the address information and hexadecimal logical addresses received from a host interface.

The producing the partial address region may include dividing the address information, which includes the logical addresses and the physical addresses sorted by hexadecimal numbers, into sections based on the block structure information and producing the partial address region from the divided address information.

The producing the partial address region from the divided address information includes computing at least two most significant word lines and at least two least significant word lines or at least two most significant bit lines and at least two least significant bit lines among a plurality of word lines or bit lines included in each of memory blocks, which are included in the semiconductor memory device and correspond to the sections, respectively, of the address information.

The reducing the address scramble logical expression includes reducing the address scramble logical expression using a Quine-McCluskey algorithm.

The method may include determining a physical address based on a received logical address using the reduced address scramble logical expression. The method may also include accessing the determined physical address, the accessing including one of storing data in the determined physical address and reading data from the determined physical address.

The method may be realized by executing a computer program for performing the method stored in a computer readable recording medium.

According to other example embodiments of the inventive concepts, there is provided a semiconductor test device including an address scramble generator configured to receive address information for each of a plurality of memory cells included in a semiconductor memory device, the address information includes a logical address and a physical address, and configured to automatically generate a reduced address scramble logical expression based on the address information; and a control unit configured to control a test operation on the semiconductor memory device based on the address scramble logical expression and a test program.

The semiconductor test device may further comprise a judging unit configured to judge whether data input to the semiconductor memory device is the same as data output from the semiconductor memory device and outputs a judging result, wherein the control unit outputs the data input to the semiconductor memory device in the test operation.

The address scramble generator may be configured to receive block structure information, the block structure information including size information corresponding to each of a plurality of memory blocks, into which the memory cells are grouped, and sequence information of the memory blocks with respect to the size information.

The address scramble generator may produce a partial address region from the address information, convert physical addresses and logical addresses that are included in the partial address region, into binary numbers, and generates the address scramble logical expression based on the converted logical addresses and the converted physical addresses.

The address scramble generator may reduce the address scramble logical expression using a given algorithm and output the reduced address scramble logical expression to the control unit.

According to another example embodiment of the inventive concepts, there is provided a method of generating an address scramble used to test a semiconductor memory device. The method may include generating an address scramble logical expression that relates logical addresses and physical addresses, the generating being based on address information that includes a logical address and a physical address for each of a plurality of memory cells in the semiconductor memory device; and reducing the address scramble logical expression using an algorithm.

The method may include receiving block structure information for the plurality of memory cells and the block structure information may include size information corresponding to each of a plurality of memory blocks, into which the memory cells are grouped, and sequence information of the memory blocks with respect to the size information. The address scramble logical expression may be generated based on the logical addresses and physical addresses and the block structure information.

The generating the address scramble logical expression may include sorting the address information by hexadecimal numbers; producing a partial address region based on the sorted address information; and re-numbering the logical addresses included in the partial address region and converting the physical addresses and the re-numbered logical addresses into binary numbers.

The method may include determining a physical address based on a received logical address using the reduced address scramble logical expression. The method may also include accessing the determined physical address, the accessing including one of storing data in the determined physical address and reading data from the determined physical address.

BRIEF DESCRIPTION OF THE DRAWINGS

The above and other features and advantages of example embodiments of the inventive concepts will become more apparent by describing in detail some example embodiments with reference to the attached drawings in which:

FIGS. 4A and 4B are tables showing an example of block structure information and address information, respectively, corresponding to the semiconductor memory device shown in FIG. 3;

FIG. 5 is a table showing an example of a block structure information regularized based on the block structure information shown in FIG. 4A;

FIG. 8 is a table showing an example of a result of generating a partial address scramble based on the partial address region illustrated in FIG. 7;

FIG. 10 is a table showing an example of an address scramble logical expression generated by an address scramble generator illustrated in FIG. 3;

FIG. 12 is a table showing an example of an address scramble logical expression minimized or at least reduced using the method illustrated in FIGS. 11A and 11B.

DETAILED DESCRIPTION OF THE EMBODIMENTS

Figure 1:
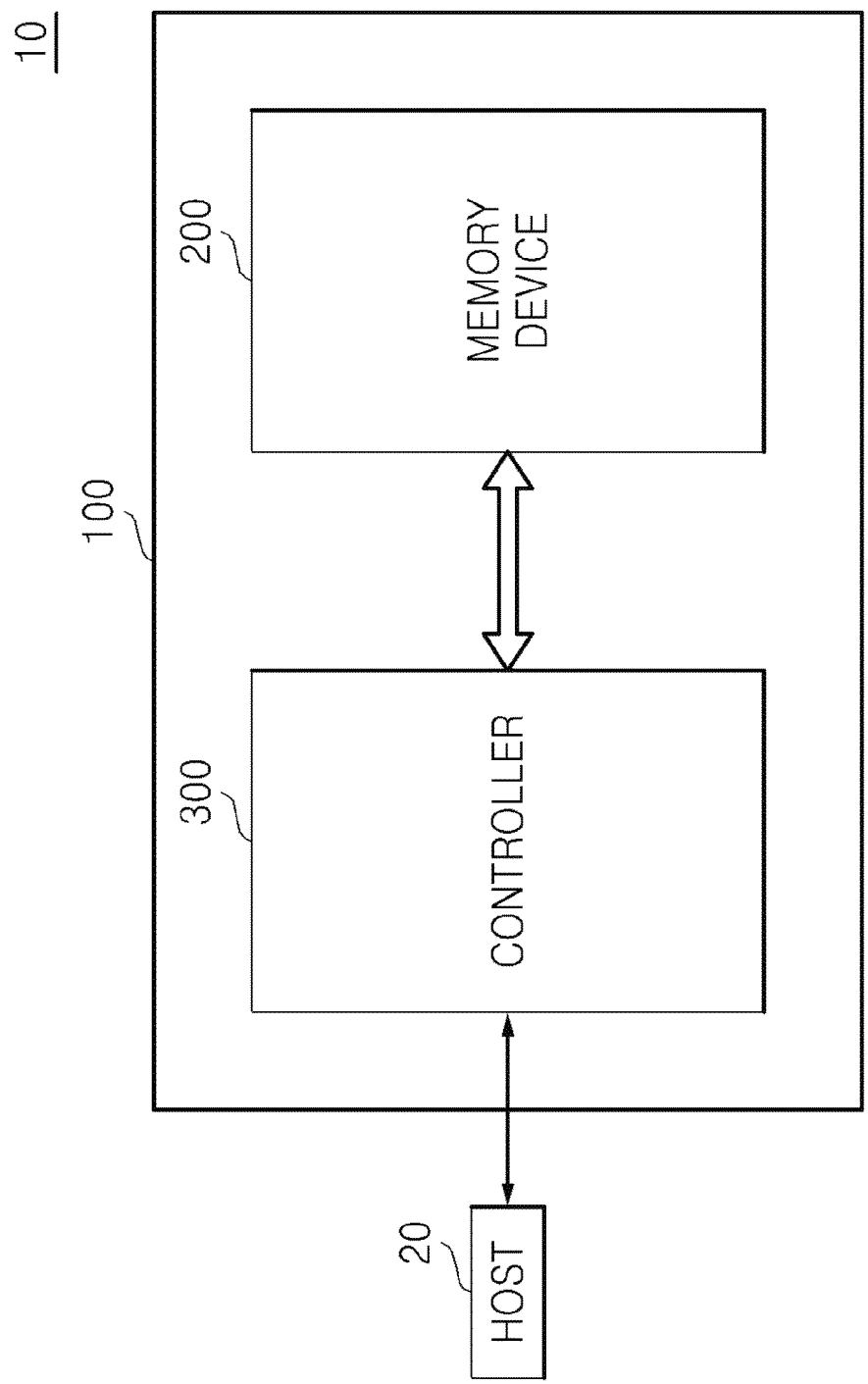
FIG. 1 is a schematic block diagram of an electronic system according to some example embodiments of the inventive concepts.

Example embodiments of the inventive concepts now will be described more fully hereinafter with reference to the accompanying drawings, in which some example embodiments of the invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of an electronic system 10 according to some example embodiments of the inventive concepts. The electronic system 10 includes a memory system 100 and a host 20. The memory system 100 may include a controller 300 and a semiconductor memory device 200.

The electronic system 10 may be a mobile device, a notebook computer, or a desktop computer, but the inventive concepts are not restricted thereto.

The controller 300 controls the overall operation of the memory system 100 and the overall data transmission between the host 20 and the semiconductor memory device 200. For example, the controller 300 controls the semiconductor memory device 200 to write data or read data at the request of the host 20. The controller 300 also applies commands to the semiconductor memory device 200 to control the operation of the semiconductor memory device 200.

The semiconductor memory device 200 is a semiconductor device that a test operation can be performed on based on an address scramble generated according to some example embodiments of the inventive concepts. The semiconductor memory device 200 may be a volatile or non-volatile memory device.

The semiconductor memory device 200 is a dynamic random access memory (DRAM) that includes a memory cell array (not shown) in which a plurality of memory cells are arranged in a row direction and a column direction, but example embodiments of the inventive concepts may be applied to both volatile and non-volatile memory devices.

FIG. 1 shows the memory system 100 in which the controller 300 controls the single semiconductor memory device 200, but the memory system 100 may include more than one semiconductor memory device.

Figure 2:
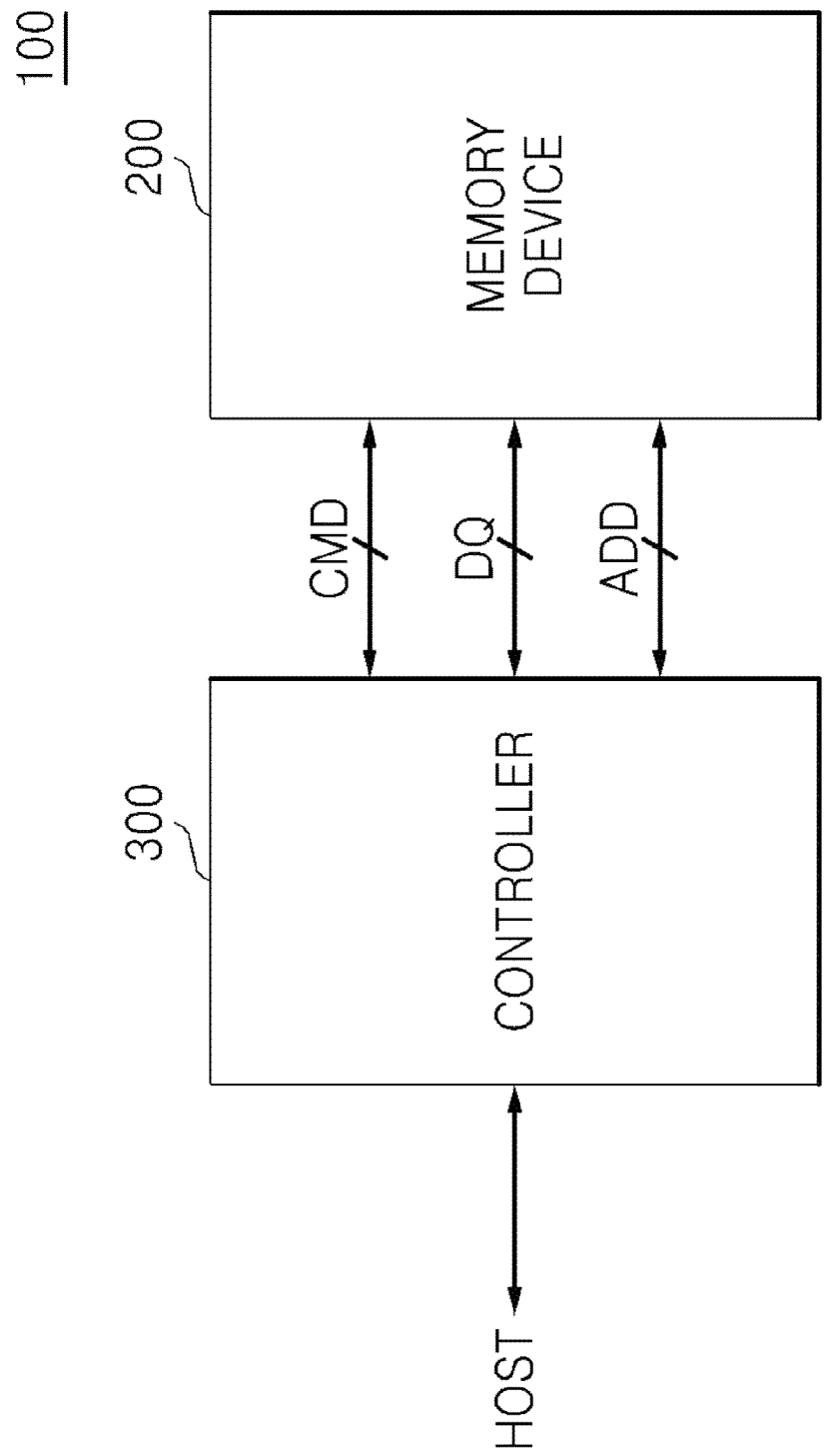
FIG. 2 is a schematic block diagram of a memory system according to some example embodiments of the inventive concepts.

FIG. 2 is a schematic block diagram of the memory system 100 according to some example embodiments of the inventive concepts. In the example embodiments, only one semiconductor memory device 200 corresponding to the controller 300 will be described as an example. Referring to FIG. 2, the controller 300 inputs data to the semiconductor memory device 200 or outputs data from the semiconductor memory device 200 through data DQ pin at the request of the host 20.

The controller 300 continuously applies an address signal ADD and a command CMD for an active operation of the semiconductor memory device 200, applies an address signal ADD and a command CMD for a write/read operation of the semiconductor memory device 200, and applies an address signal ADD and a command CMD for a refresh operation of the semiconductor memory device 200, to the semiconductor memory device 200.

A test operation can be performed on the semiconductor memory device 200 using a semiconductor test device in order to determine whether the state of memory cells in the semiconductor memory device 200 are good.

Figure 3:
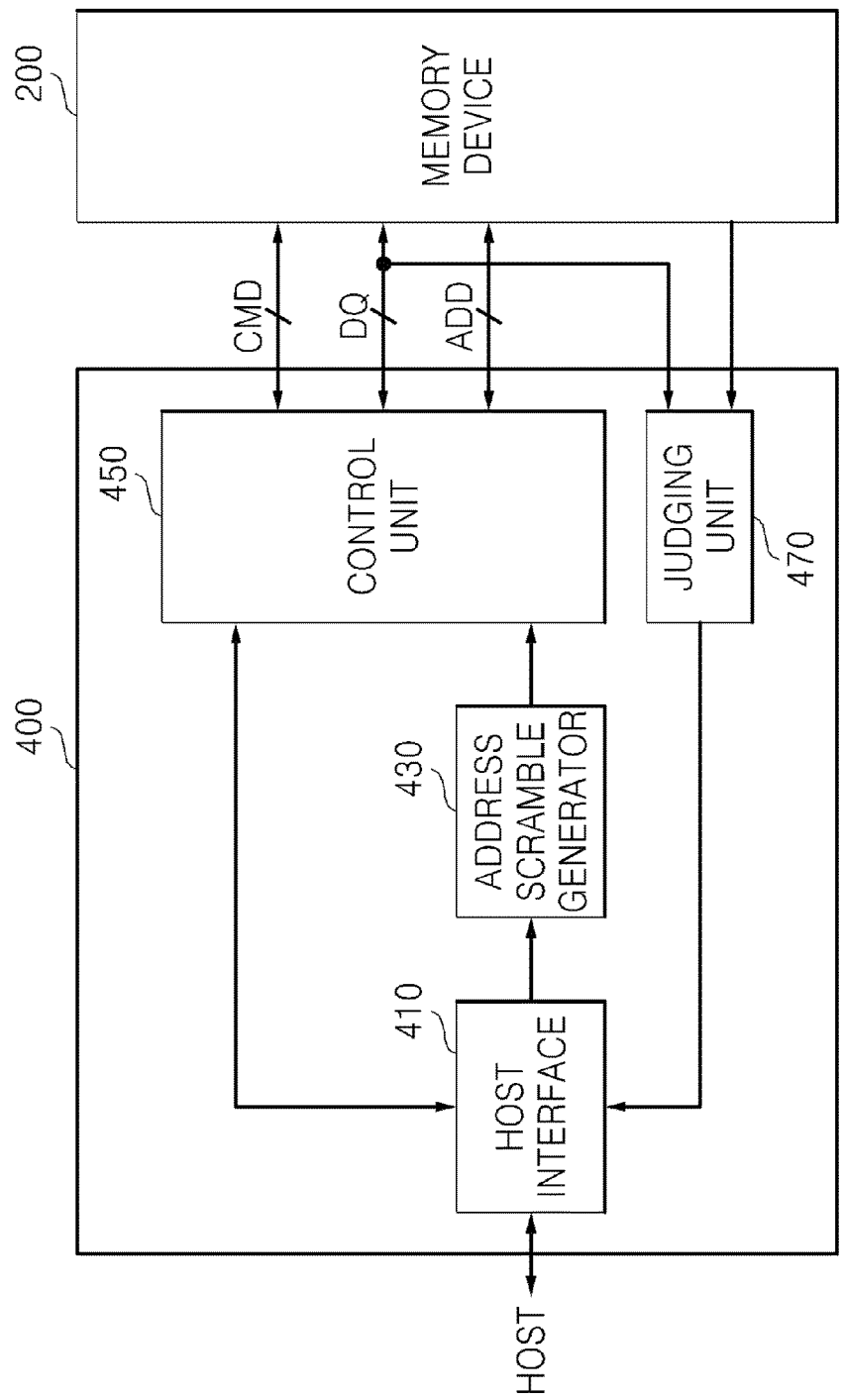
FIG. 3 is a schematic block diagram of a semiconductor test device according to some example embodiments of the inventive concepts.

FIG. 3 is a schematic block diagram of a semiconductor test device 400 according to some example embodiments of the inventive concepts. Referring to FIG. 3, the semiconductor test device 400 includes a host interface 410, an address scramble generator 430, a control unit 450, and a judging unit 470.

In the test operation of the semiconductor memory device 200, the host interface 410 receives a test program and block structure information and address information, which correspond to the semiconductor memory device 200, from the host 20. The host interface 410 transmits the test program to the control unit 450 and transmits the block structure information and the address information to the address scramble generator 430.

The address scramble generator 430 may automatically generate an address scramble minimized or at least reduced based on the block structure information and the address information transmitted from the host interface 410 and output the address scramble to the control unit 450. The operation of the address scramble generator 430 will be described in detail later.

The control unit 450 performs a test operation on the semiconductor memory device 200 based on the test program transmitted from the host interface 410.

The control unit 450 applies data DQ and a command CMD to the semiconductor memory device 200 based on logical address information included in the test program. The control unit 450 may apply the address scramble received from the address scramble generator 430 to the semiconductor memory device 200 as an address signal ADD.

The control unit 450 may also output the data DQ applied to the semiconductor memory device 200 to the judging unit 470 as reference data.

The judging unit 470 judges whether data output from the semiconductor memory device 200 is the same as the reference and outputs a judging result to the host interface 410. The control unit 450 may function to control the test operation of the semiconductor memory device 200 and may also perform the functions of the controller 300 illustrated in FIGS. 1 and 2.

Although FIG. 3 shows that the semiconductor test device 400 performs a test operation on only one semiconductor memory device 200, the inventive concepts are not restricted to the example embodiments illustrated in FIG. 3. The semiconductor test device 400 may perform a test operation on at least one semiconductor memory device.

FIG. 4A is a table showing block structure information corresponding to the semiconductor memory device 200 shown in FIG. 3. FIG. 4B is a table showing address information corresponding to the semiconductor memory device 200 shown in FIG. 3.

Referring to FIG. 4A, the semiconductor memory device 200 may include a memory cell array (not shown) in which a plurality of memory cells are arranged. The memory cell array may have four memory banks (e.g., first through fourth memory banks). Each of the four memory banks includes a plurality of memory blocks, which may be different in size.

The block structure information of the semiconductor memory device 200 may include size information corresponding to each of the memory blocks L0 through L19 and R0 through R19 and row address information, i.e., X-address information corresponding to the size of each block. Block structure information regularized based on the size information and the X-address information is shown in FIG. 5.

FIG. 5 is a table showing an example of the block structure information regularized based on the block structure information shown in FIG. 4A. As shown in FIG. 5, a designer of the semiconductor memory device 200 may regularize the block structure information corresponding to the semiconductor memory device 200 illustrated in FIG. 4A. For example, block structure information included in a memory bank of the semiconductor memory device 200 may be regularized to indicate that blocks with a size of 1A0 in hexadecimal number and blocks with a size of 180 in hexadecimal number have a sequence of 1A0-1A0-180-1A0-1A0.

Referring to FIG. 4B, the address information of the semiconductor memory device 200 may include physical address information corresponding to a logical address of each of the X-address and the column address, i.e., Y-address of each of the memory cells. The logical address may signify an address used outside the semiconductor memory device 200 while the physical address may signify an address used inside the semiconductor memory device 200.

A designer of the semiconductor memory device 200 may provide the block structure information and the address information, which correspond to the semiconductor memory device 200, to the address scramble generator 430 through the host interface 410. In addition, the designer of the semiconductor memory device 200 may provide the regularized block structure information of the semiconductor memory device 200 to the address scramble generator 430.

The block structure information and the address information illustrated in FIGS. 4A through 5 may be different depending on the structure of the semiconductor memory device 200. In some example embodiments of the inventive concepts, a method of generating an address scramble corresponding to an X-address for the semiconductor memory device 200 including 160 memory blocks will be described.

Figure 6:
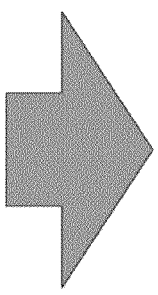
FIG. 6 is a diagram showing an example of a result of sorting physical addresses by hexadecimal numbers based on the address information illustrated in FIG. 4B and a logical address.

FIG. 6 is a diagram showing an example of a result of sorting physical addresses by hexadecimal numbers based on the address information illustrated in FIG. 4B and a logical address. Referring to FIGS. 1 through 6, the address scramble generator 430 may sort the physical addresses by hexadecimal numbers based on the address information corresponding to the semiconductor memory device 200 and hexadecimal logical addresses received from the host interface 410.

A physical address corresponding to an X-address included in the address information may further include bank address information items X14 and X15 in addition to memory cell address information items X0 through X13 included in the address information illustrated in FIG. 4B.

Referring to FIG. 6, the address scramble generator 430 may consider as Q0 through Q15 16-bit values resulting from converting a hexadecimal logical address received from the host interface 410 into a binary number and may generate a hexadecimal physical address by applying the values Q0 through Q15 to the address information.

For example, when the address information is applied to a logical address of "000F", if Q0 is "1", X0 is also "1"; and if Q1 and Q2 are "1", X1 is "0". When such operation is performed up to Q15, a physical address of "000D" is generated corresponding to the logical address of "000F"

Figure 7:
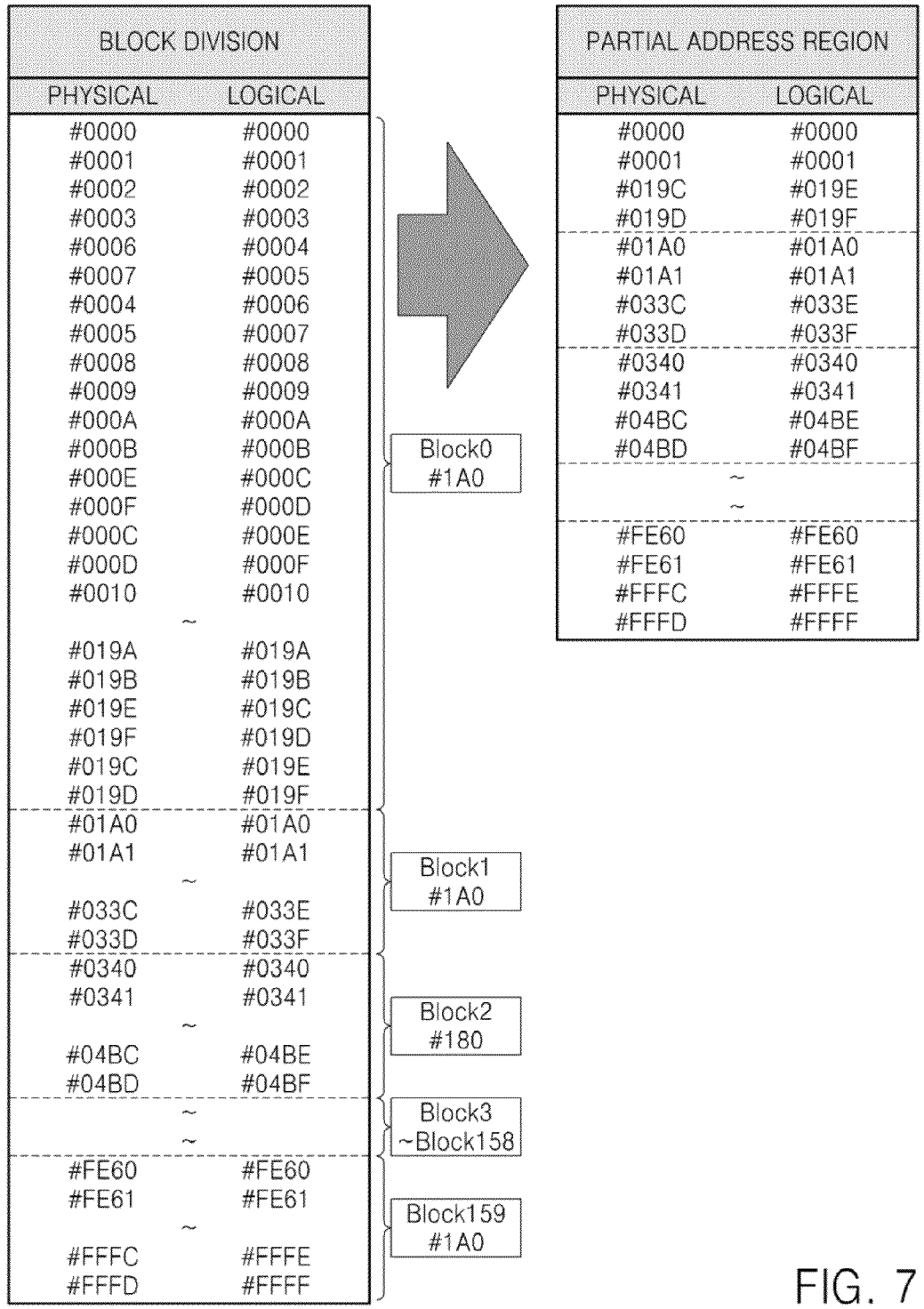
FIG. 7 is a diagram showing an example of a process of producing a partial address region based on address information illustrated in FIG. 6.

FIG. 7 is a diagram showing an example of a process of producing a partial address region based on the address information illustrated in FIG. 6. FIG. 8 is a table showing an example of a result of generating a partial address scramble based on the partial address region illustrated in FIG. 7. As shown in FIG. 7, the address scramble generator 430 may divide the address information, which includes physical and logical addresses in hexadecimal numbers, into a plurality of sections based on the block structure information corresponding to the semiconductor memory device 200, which is received from the host interface 410.

In addition, the address scramble generator 430 may produce the partial address region by computing two most significant word lines and two least significant word lines among a plurality of word lines included in each of the memory blocks.

For example, hexadecimal physical addresses and hexadecimal logical addresses may be divided based on information about 160 memory blocks Block0 through Block159, which have a sequence of 1A0-1A0-180-1A0-1A0. Two most significant word lines and two least significant word lines can be extracted from an address information section corresponding to each of the memory blocks.

Although FIG. 7 illustrates example embodiments that the partial address region is produced by computing the two most significant and two least significant word lines from each memory block, the inventive concepts are not restricted to these example embodiments. For example, the partial address region may be produced by extracting at least two word lines or at least two bit lines from each memory block.

As shown in FIG. 8, when physical addresses corresponding to logical addresses in the partial address region are sequentially arranged, a one-on-one partial address scramble may be generated. However, test controllers that can use the one-on-one partial address scramble may be limited. To overcome this problem, an additional conversion process is desired to generate an address scramble that can be used in any type of test controllers.

Figure 9:
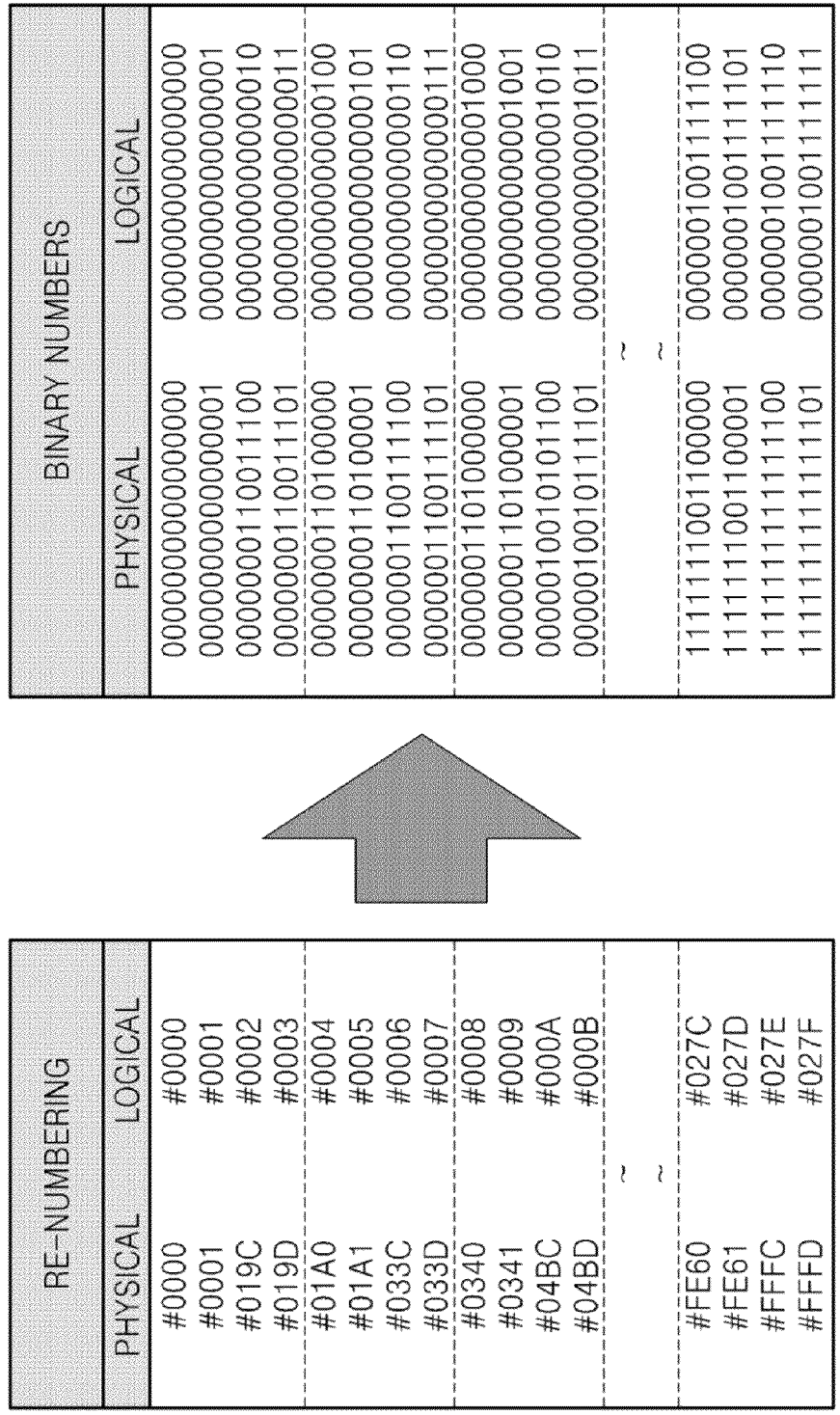
FIG. 9 is a diagram showing an example of a result of re-numbering logical addresses included in the partial address region illustrated in FIG. 7 and converting them into binary numbers.

FIG. 9 is a diagram showing an example of a result of re-numbering logical addresses included in the partial address region illustrated in FIG. 7 and converting them into binary numbers. FIG. 10 is a table showing an example of an address scramble logical expression generated by the address scramble generator 430 illustrated in FIG. 3. As shown in FIG. 9, the address scramble generator 430 re-numbers the logical addresses in the partial address region produced in FIG. 7.

The address scramble generator 430 may convert the physical addresses and the re-numbered logical addresses in the partial address region into binary numbers. Bits of each physical address may be respectively denoted by X15 to X0 and bits of each logical address may be respectively denoted by AX15 through AX0.

The address scramble generator 430 enumerates logical addresses corresponding to each of the 16 bits of a physical address when generating an address scramble logical expression.

For example, as shown in FIGS. 9 and 10, when a bit X15 among 16 bits of a physical address is "1" based on the binary logical addresses and the binary physical addresses, logical addresses corresponding to the bit X15 may be enumerated. Logical addresses corresponding to each of the bits X15 to X0 of a physical address are computed, so that an address scramble logical expression corresponding to one memory cell among a plurality of memory cells included in the semiconductor memory device 200 is generated.

However, since only a bit corresponding to X15 in a physical address of 16 bits X15 to X0 is defined by a complex logical expression as shown in FIG. 10 according to the address scramble logical expression that is finally generated, the address scramble logical expression requires a lot of time for compiling.

Figure 11A:
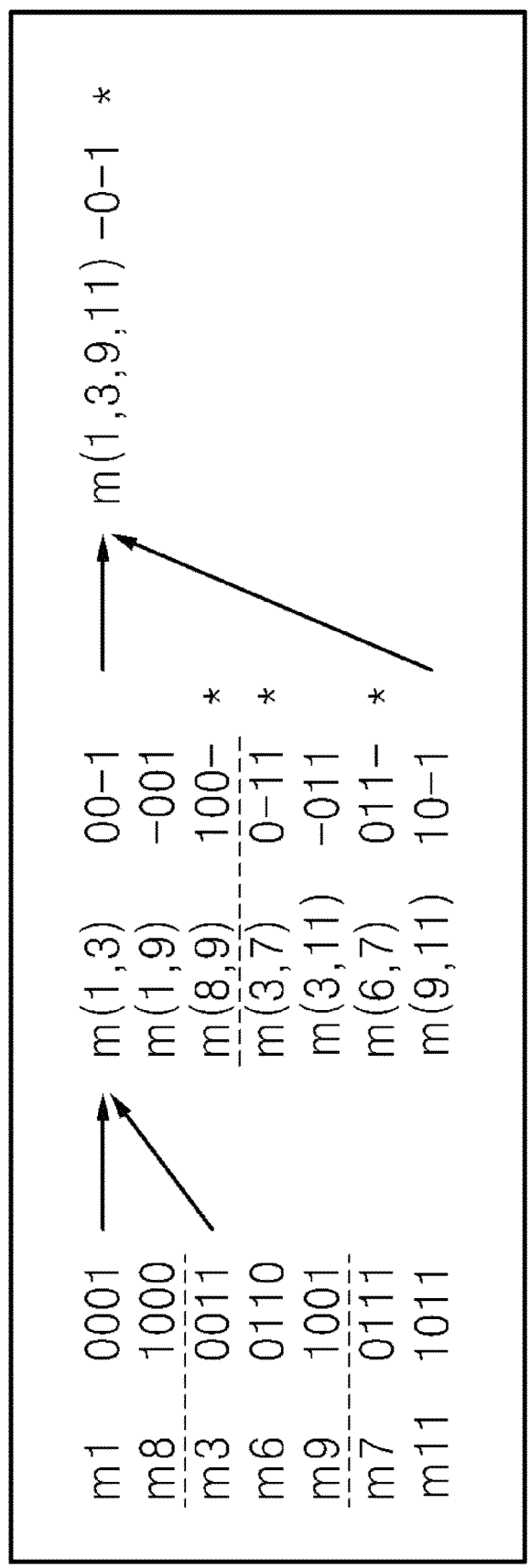
FIGS. 11A and 11B are tables showing an example of a method of minimizing or at least reducing the address scramble logical expression illustrated in FIG. 10.
Figure 11B:
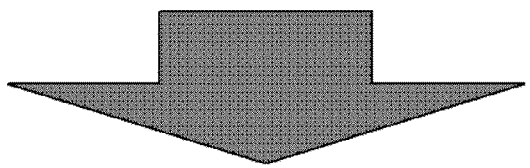

FIGS. 11A and 11B are tables showing an example of a method of minimizing or at least reducing the address scramble logical expression illustrated in FIG. 10. FIG. 12 is a table showing an example of an address scramble logical expression minimized or at least reduced using the method illustrated in FIGS. 11A and 11B. In the example embodiments illustrated in FIGS. 11A and 11B, a physical address and a logical address are 4 bits in length, but some example embodiments of the inventive concepts can also be applied to physical addresses and logical addresses that are 16 bits in length, as shown in FIG. 10.

Referring to FIG. 11A, when there are logical addresses of "0001", "0011", "0110", "0111", "1000", "1001", and "1011" in a case where a bit X0 in a physical address is "1", an address scramble logical expression is defined as X0=A'B'C'D+A'B'CD+A'BCD'+A'BCD+AB'C'D'+AB'C'D+AB'CD. The address scramble generator 430 may converts the minterms into decimal numbers, so that the address scramble logical expression is rewritten as X0=m1+m3+m6+m7+m8+m9+m11.

The address scramble generator 430 converts the minterms into binary numbers, counts the number of 1 s included in each of the minterms converted into binary numbers, and groups the minterms by the number of 1 s. Minterms having different values at only one digit between adjacent groups are repeatedly combined. A prime implicant (PI) may be produced by minterms that have not been combined.

The PI refers to minterms needed to present the address scramble logical expression. The address scramble logical expression is minimized or at least reduced using the PI from X0=A'B'C'D+A'B'CD+A'BCD'+A'BCD+AB'C'D'+AB'C'D+AB'CD to X0=AB'C'+A'CD+A'BC+B'D.

The PI is produced based on a result of comparing the minterms one on one, and therefore, it is possible that there is a PI that may be omitted by the combination of at least two PIs. It is necessary to minimize or at least reduce the address scramble logical expression, which has been reduced using the PI, once more.

For the minimization or reduction, minterms included in any of the PIs and original address scramble logical expression are listed, and the minterms included in any of the PIs are marked. Among the marked minterms, a minterm that is included in only one PI is detected. A PI including the detected minterm is produced as an essential PI (EPI).

When there is a minterm that is not included in the EPI, among PIs including the minterm a PI that has a minimum number of minterms may be produced as an additional EPI. PIs that are not produced as EPIs may be omitted from the address scramble logical expression.

For example, as shown in FIG. 11B, a minterm "1" is included only in m(1, 3, 9, 11), a minterm "6" is included only in m(6, 7), a minterm "8" is included only in m(8, 9), and a minterm "11" is included only in m(1, 3, 9, 11). Accordingly, m(6, 7), m(8, 9), and m(1, 3, 9, 11) may be determined as EPIs. However, since minterms "3" and "7" included in m(3, 7) are also respectively included in m(1, 3, 9, 11) and m(6, 7); the PI, m(3, 7), may be omitted.

When the address scramble logical expression is minimized or at least reduced using the EPIs, X0=AB'C'+A'BC+B'D is obtained, so that an address scramble logical expression more minimized or at least reduced than the address scramble logical expression generated using only PIs is generated.

Accordingly, when the method illustrated in FIGS. 11A and 11B is applied to the address scramble logical expression illustrated in FIG. 10, a minimized or at least reduced address scramble logical expression shown in FIG. 12 is generated.

FIGS. 11A and 11B show an example in which an address scramble logical expression is minimized or at least reduced using a Quine-McCluskey algorithm, but the inventive concepts are not restricted thereto.

Figure 13:
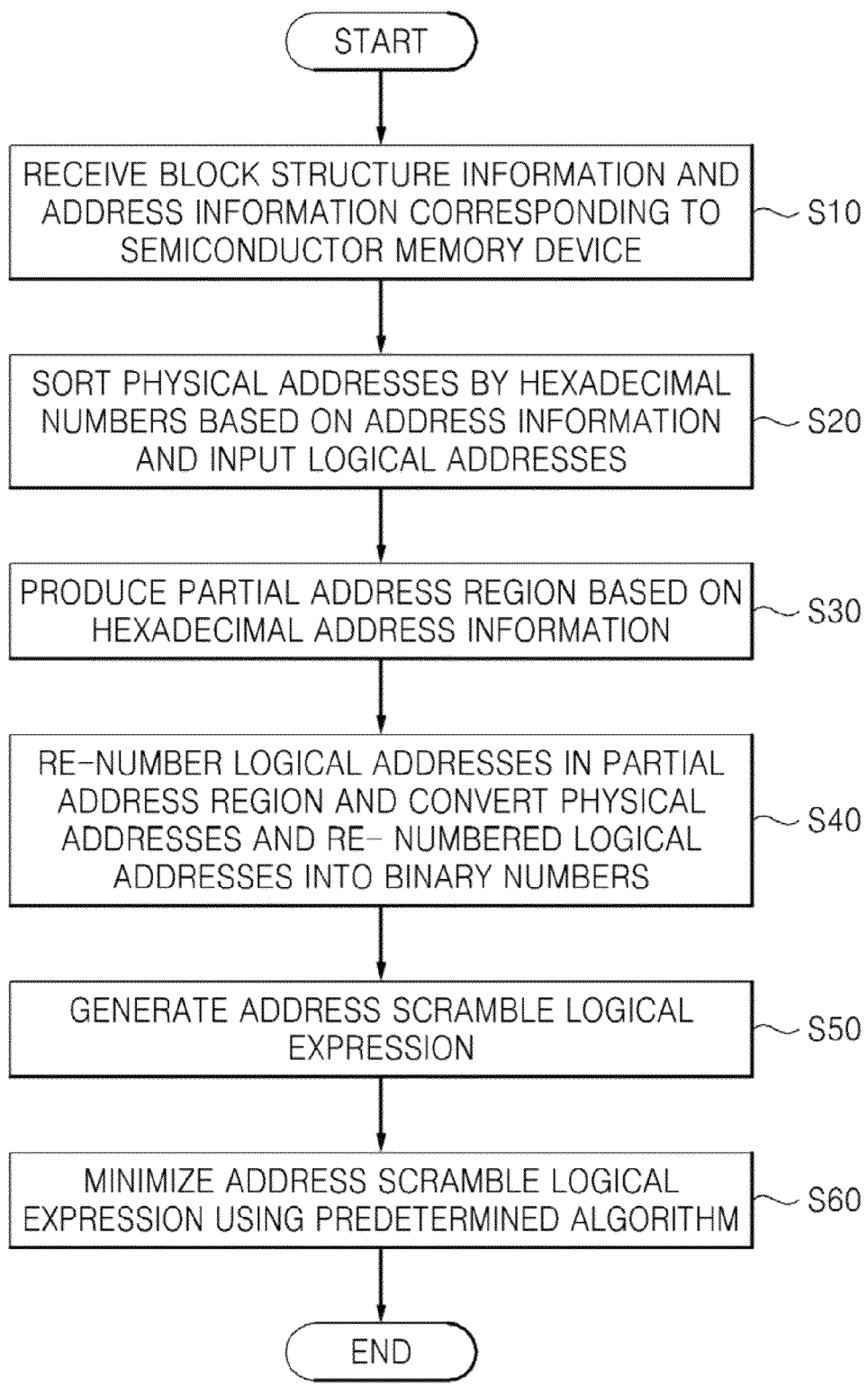
FIG. 13 is a flowchart of a method of generating an address scramble according to some example embodiments of the inventive concepts.

FIG. 13 is a flowchart of a method of generating an address scramble according to some example embodiments of the inventive concepts. Referring to FIGS. 1 through 13, the address scramble generator 430 receives block structure information and address information, which correspond to the semiconductor memory device 200, from the host interface 410 in operation S10.

The address scramble generator 430 sorts physical addresses by hexadecimal numbers based on the address information and hexadecimal logical addresses received from the host interface 410 in operation S20.

The address scramble generator 430 produces a partial address region based on the address information sorted by hexadecimal numbers in operation S30. The address scramble generator 430 re-numbers logical addresses in the partial address region and converts physical addresses and the re-numbered logical addresses, which are included in the partial address region, into binary numbers in operation S40.

The address scramble generator 430 generates an address scramble logical expression including logical addresses corresponding to each of the physical address based on the binary address information in operation S50 and minimizes or at least reduces the address scramble logical expression using a given algorithm in operation S60.

Consequently, the address scramble generator 430 automatically generates an address scramble corresponding to the semiconductor memory device 200 based on the block structure information and the address information received from the host 20. Since the address scramble generator 430 minimizes or at least reduces the address scramble logical expression, the time required for compiling is reduced.

Example embodiments of the inventive concepts can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concepts can be easily construed by programmers.

As described above, in a semiconductor test device and a method of generating an address scramble according to some example embodiments of the inventive concepts, an address scramble is automatically generated based on a block structure of a memory cell array, which is different among semiconductor memory devices, so that the semiconductor test device and the method can be used for any type of semiconductor memory devices.

In addition, since the address scramble is automatically generated, human errors are prevented and compiling time is reduced.

While the inventive concepts have been particularly shown and described with reference to example embodiments thereof, it will be understood by those of ordinary skill in the art that various changes in forms and details may be made therein without departing from the spirit and scope of the inventive concepts as defined by the following claims.

What is claimed is:

1. A method of generating an address scramble used to test a semiconductor memory device, the method comprising:
receiving address information for each of a plurality of memory cells included in the semiconductor memory device, the address information including a logical address and a physical address that correspond to each of the memory cells;
generating an address scramble logical expression, the address scramble logical expression relating logical addresses to physical addresses based on the address information, the generating the address scramble logical expression including,
sorting the address information by hexadecimal numbers,
producing a partial address region based on the sorted address information, and
re-numbering the logical addresses included in the partial address region and converting the physical addresses and the re-numbered logical addresses that are included in the partial address region into binary numbers;
reducing the address scramble logical expression using a given algorithm;
receiving block structure information including size information corresponding to each of a plurality of memory blocks, into which the memory cells are grouped, and sequence information of the memory blocks with respect to the size information; and
the address scramble logical expression is generated based on the address information and the block structure information.

2. The method of claim 1, wherein the sorting the address information by hexadecimal numbers includes sorting the physical addresses included in the address information by hexadecimal numbers based on the address information and hexadecimal logical addresses received from a host interface.

3. The method of claim 2, wherein the producing the partial address region includes dividing the address information, which includes the logical addresses and the physical addresses sorted by hexadecimal numbers, into sections based on the block structure information and producing the partial address region from the divided address information.

4. The method of claim 3, wherein the producing the partial address region from the divided address information includes computing at least two most significant word lines and at least two least significant word lines or at least two most significant bit lines and at least two least significant bit lines among a plurality of word lines or bit lines included in each of memory blocks, which are included in the semiconductor memory device and correspond to the sections, respectively, of the address information.

5. The method of claim 4, wherein the reducing the address scramble logical expression includes reducing the address scramble logical expression using a Quine-McCluskey algorithm.

6. The method of claim 1, further comprising:
determining a physical address based on a received logical address using the reduced address scramble logical expression.

7. The method of claim 6, further comprising:
accessing the determined physical address, the accessing including one of storing data in the determined physical address and reading data from the determined physical address.

8. A non-transitory recording medium for recording a program for executing the method of claim 1.

9. A semiconductor test device comprising:
an address scramble generator configured to,
receive address information for each of a plurality of memory cells included in a semiconductor memory device, the address information including a logical address and a physical address,
automatically generate a reduced address scramble logical expression based on the address information,
receive block structure information, the block structure information including size information corresponding to each of a plurality of memory blocks, into which the memory cells are grouped, and sequence information of the memory blocks with respect to the size information,
produce a partial address region from the address information,
convert physical addresses and logical addresses that are included in the partial address region into binary numbers, and
generate the address scramble logical expression based on the converted logical addresses and the converted physical addresses;
a control unit configured to control a test operation on the semiconductor memory device based on the address scramble logical expression and a test program;
a judging unit configured to judge whether data input to the semiconductor memory device is the same as data output from the semiconductor memory device and outputs a judging result; and
the control unit is configured to output the data input to the semiconductor memory device in the test operation.

10. The semiconductor test device of claim 9, wherein the address scramble generator is configured to reduce the address scramble logical expression using a given algorithm and outputs the reduced address scramble logical expression to the control unit.

11. A method of generating an address scramble used to test a semiconductor memory device, the method comprising:
generating an address scramble logical expression that relates logical addresses and physical addresses, the generating being based on address information that includes a logical address and a physical address for each of a plurality of memory cells in the semiconductor memory device, the generating including,
sorting the address information by hexadecimal numbers;
producing a partial address region based on the sorted address information, and
re-numbering the logical addresses included in the partial address region and converting the physical addresses and the re-numbered logical addresses into binary numbers;
reducing the address scramble logical expression using an algorithm;
receiving block structure information for the plurality of memory cells, the block structure information including size information corresponding to each of a plurality of memory blocks, into which the memory cells are grouped, and sequence information of the memory blocks with respect to the size information; and
wherein the address scramble logical expression is generated based on the logical addresses and physical addresses and the block structure information.

12. The method of claim 11, further comprising:
determining a physical address based on a received logical address using the reduced address scramble logical expression.

13. The method of claim 12, further comprising:
accessing the determined physical address, the accessing including one of storing data in the determined physical address and reading data from the determined physical address.

* * * * *